United States Patent
Lin et al.

(10) Patent No.: US 6,642,874 B1
(45) Date of Patent: Nov. 4, 2003

(54) SIGMA-DELTA DATA CONVERSION EMPLOYING QUANTIZATION ERROR FEEDBACK

(75) Inventors: Chia-Liang Lin, Union City, CA (US); Tzu-Hsien Sang, Sunnyvale, CA (US)

(73) Assignee: Realtek Semiconductor Corp., Hsinchu (TW)

(*) Notice: Subject to any disclaimer, the term of this patent is extended or adjusted under 35 U.S.C. 154(b) by 0 days.

(21) Appl. No.: 10/269,594

(22) Filed: Oct. 11, 2002

(51) Int. Cl.[7] ............................................. H03M 3/00
(52) U.S. Cl. ....................................................... 341/143
(58) Field of Search ................................. 341/143, 134, 341/144, 155

(56) References Cited

U.S. PATENT DOCUMENTS 6,531,973 B2 * 3/2003 Brooks ........................ 341/143
6,567,025 B2 * 5/2003 Schreier ...................... 341/143

* cited by examiner

*Primary Examiner*—Brian Young
(74) *Attorney, Agent, or Firm*—Daniel J. Bedell; Smith-Hill and Bedell (57) ABSTRACT

A sigma-delta circuit converts an analog or digital input sequence $x_n$ representing a quantity with at least p-bit resolution into an m-bit output sequence $y_n$, where m<p<0. The sigma-delta circuit offsets the $x_n$ sequence by a first feedback sequence $c_n$ that is proportional to output sequence $y_n$ to produce a sequence $a_n$. The signal-delta circuit filters the $a_n$ sequence using a filter having a transfer function $H(z^{-1})$ to produce a sequence $d_n$ that is offset by a second feedback sequence $r_n$ to produce an analog or digital sequence $b_n$. The $b_n$ sequence is then digitized or quantized to produce the lower resolution m-bit output $y_n$ sequence. To increase the signal-to-noise ratio within a signal band of interest, the sigma-delta circuit includes a quantization error feedback circuit for processing the $b_n$ and $y_n$ sequences to generate a quantization error sequence $e_n$ representing a difference between values the $b_n$ and $y_n$ sequences represent, and for filtering the $e_n$ sequence with a transfer function $R(z^{-1})$ to produce the $r_n$ sequence. The quantization noise in the signal band can be shaped by adjusting $R(z^{-1})$ without affecting the sigma-delta circuit's response to the x(n) sequence, which is controlled by $H(z^{-1})$ and not influenced by $R(z^{-1})$.

30 Claims, 4 Drawing Sheets

SIGMA-DELTA DATA CONVERSION EMPLOYING QUANTIZATION ERROR FEEDBACK

BACKGROUND OF THE INVENTION

1. Field of the Invention

The present invention relates in general to sigma-delta data converters, and in particular to a sigma-delta data converter providing improved quantization noise shaping through error feedback.

2. Description of Related Art

Sigma-Delta ADC Architecture

FIG. 1 depicts a prior art sigma-delta analog-to-digital converter (ADC) 10 including a sample and hold (S/H) circuit 12, a sigma-delta modulator 14, and a digital decimator 16, for digitizing an analog input signal $A_{IN}$ to produce an output data sequence D representing the analog input signal. S/H circuit 12 samples the $A_{IN}$ signal on each pulse of a clock signal (CLOCK) at a rate much higher than the $A_{IN}$ signal bandwidth to produce a sequence of discrete analog samples $x_n$ supplied as input to sigma-delta modulator 14. Sigma-delta modulator 14 responds to each pulse of the CLOCK signal by generating an element of an output sequence $y_n$. When each element of the $y_n$ sequence is, for example, a single bit wide, sigma-delta modulator 14 sets the $y_n$ bit to a logical 1 increasingly more frequently than to a logical 0 as $A_{IN}$ increases in magnitude so that the density of 1's in the $y_n$ sequence is proportional to the magnitude of $A_{IN}$. When the $y_n$ sequence is more than one bit, sigma-delta modulator 14 generates higher values of $y_n$ with increasing frequency as $A_{IN}$ increases. Decimator 16 carries out the function of a finite impulse response (FIR) filter, filtering the $y_n$ sequence to produce a sequence of elements $$D_n = \sum_{i=-N1}^{N2} f_i y_{n-i}$$

Sigma-delta modulator 14 includes an analog summing circuit 18, an analog filter 20 having a discrete transfer function $H(z^{-1})$, an m-bit ADC converter 22, and an m-bit digital-to-analog converter 24. Filter 20 filters the output sequence an of summer 18 to produce an analog sequence $b_n$. ADC 22 digitizes $b_n$ to produce $y_n$. For example when m=1, and $b_n$ is above a threshold level, ADC 22 sets $y_n$ to a 1 and otherwise sets $y_n$ to a 0 when $b_n$ is below the threshold level. DAC 24 therefore drives its analog output signal $c_n$ to the maximum expected level of $x_n$ when $y_n$ is a 1 and drives $c_n$ to the minimum expected level of $x_n$ when $y_n$ is a 0. The feedback loop formed by devices 18–24 tries to keep $b_n$ at the ADC's threshold level and to do that, it has to drive $y_n$ to a 1 with a frequency that increases with the amplitude of $A_{IN}$. Modulator 14 operates in a generally similar manner when m>1 except that ADC 22 and DAC 24 adjust $y_n$ and $c_n$ with m-bit resolution.

Sigma-Delta DAC

FIG. 3 illustrates a conventional sigma-delta DAC 30 for converting a sequence of p-bit data words $x_n$ into an analog output signal A. DAC 30 includes a sigma-delta demodulator 32 for converting $x_n$ into an m-bit wide output sequence $y_n$. An m-bit DAC 34 drives its output A' high or low depending on the state of $y_n$, and an analog filter 36 removes out-of-band quantization noise from the A' signal to produce the A signal. Sigma-delta demodulator 32 includes a summer 38 for generating a data value $a_n = x_n - c_n$, a digital filter 40 for filtering the $a_n$ data sequence with a transfer function $H(z^{-1})$ to produce a data sequence $b_n$, and a digital quantizer 42 for generating an element of the $y_n$ sequence in response to each corresponding element of the $b_n$ sequence. Each element of the $y_n$ sequence has m bits, where m is more than zero and less than the number of bits of elements of the $b_n$ sequence, and each element of the $y_n$ sequence represents the same quantity as a corresponding element of the $b_n$ sequence, but with lower resolution. The $y_n$ sequence is provided as the $c_n$ sequence input to summer 38 which where N1 and N2 are integers and FIR filter coefficients $f_{-N1} - f_{N2}$ are numbers selected to give decimator 16 selected low pass or band pass characteristics to eliminate aliasing and out-of-band quantization noise. Decimator 16 reduces the number of elements of the $D_n$ sequence by a factor of k to produce output sequence D. That is, only every kth element of the $D_n$ sequence becomes an element of the D sequence.

FIG. 2 is a timing diagram illustrating a simple example wherein k=3, i has values of the set {-1, 0, 1}, and all filter coefficients $f_{-1} = f_0 = f_1 = 1$. Thus in this example each element of the D sequence is equal to a sum of a separate set of k=three elements of the $y_n$ sequence, although in practice filter coefficients f will often have values other than 1 to provide desired low pass or band pass filter characteristics.

ADC 10 has an input range of 0–3 volts, and the $A_{IN}$ signal ramps linearly from 0 to 3 volts during 36 CLOCK cycles, and the $x_n$ signal is a step-wise approximation of the $A_{IN}$ signal. Note that the density of 1's in the $y_n$ sequence increases with the magnitude of $x_n$. In this simple example, decimator 16 sums the preceding three $y_n$ sequence bits to produce each element of the D sequence. A digital data word having n bits represents a magnitude with "n-bit resolution" since the word can have any of $2^n$ different combinations of bit states, each of which represents a different magnitude. In the example of FIG. 2, the output sequence D of ADC 10 represents input signal magnitude $A_{IN}$ with 2-bit resolution because the 2-bit wide elements of the D sequence can be any of $2^2$ values of the set {0, 1, 2, 3}. We can increase the resolution of ADC 10 by increasing k. For example, if decimator 16 sums $y_n$ sequence elements during k=255 clock cycles, then elements of the D sequence would be 8-bits wide and could represent $2^8$ different signal magnitudes. However to avoid aliasing, the clock signal frequency should be at least k times the Nyquist frequency of the $A_{IN}$ signal. subtracts the $c_n$ sequence from the most significant bits of the $x_n$ sequence. Sigma-delta DAC 30 can control the magnitude of output analog signal A with substantially higher resolution than DAC 34, provided that the frequency at which $x_n$ sequence are provided is substantially higher than the highest frequency component of output signal A.

Quantization Noise

The ADC 22 of FIG. 1 and digital quantizer 42 essentially "round off" the value represented by their input $b_n$ sequences to produce their output sequences $y_n$. For example when $b_n$ can represent any integer value between 0 and 7, and $y_n$ is only one bit wide, a $y_n$ value of 0 is equivalent to a $b_n$ value of 0 and $y_n$ value of 1 is equivalent to a $b_n$ value of 7. When $b_n$ has some value between 0 and 7, ADC 22 or digital quantizer 42 essentially rounds $b_n$ down to 0 or up to 7 when determining whether to set $y_n$ to a 0 or a 1. Thus, for example, when $b_n$ has value 2, $y_n$ will be set to 0 and the difference between the values represented by corresponding $b_n$ and $y_n$ sequence element (called the "quantization error" of the sigma-delta modulator or demodulator) will be $b_n - y_n = 2 - 0 = 2$. When $b_n$ has value 6, $y_n$ will be set to a 1 (representing 7) and the quantization error will be 6-7=-1.

The quantization error can be reduced by increasing the width m of $y_n$ but cannot be eliminated since in a sigma-delta modulator or demodulator because $y_n$ always has fewer bits than $b_n$.

To improve the accuracy of ADC 10 or DAC 30, it is beneficial to reduce the effects of quantization error on DUT. The quantization error introduced by ADC 22 or digital quantizer 32 can be modeled as additive noise sequence $e_n$ as illustrated in FIG. 4. The z-transform $Y(z^{-1})$ of sequence y(n) can be expressed as a linear function of the z-transforms $X(z^{-1})$ and $E(z^{-1})$ of analog or digital input sequence x(n) and error sequence $e_n$.

$$Y(z^{-1}) = \frac{H(z^{-1})X(z^{-1})}{[1+H(z^{-1})]} + \frac{E(z^{-1})}{[1+H(z^{-1})]}$$

where $H(z^{-1})$ is the z-transform of the transfer function of filter 20. The transfer function $G(z^{-1})$ of modulator 14 or demodulator 32 as seen by input sequence $x_n$ is $$G(z^{-1}) = \frac{Y(z^{-1})}{X(z^{-1})}\bigg|_{E(z^{-1})=0} = \frac{H(z^{-1})}{1+H(z^{-1})} \quad [1]$$

The transfer function of modulator 14 or demodulator 32 as seen by the additive noise sequence $e_n$ is:

$$F(z^{-1}) = \frac{Y(z^{-1})}{E(z^{-1})}\bigg|_{X(z^{-1})=0} = \frac{1}{1+H(z^{-1})} \quad [2]$$

The input sequence $x_n$ includes components within a limited signal band, while the additive quantization noise sequence $e_n$ is uniformly distributed over the entire frequency spectrum. When the $x_n$ sequence has only low frequency components, designers choose filter function $H(z^{-1})$ such that $F(z^{-1})$ is a high-pass response decreasing quantization noise at low frequencies and increasing it at high frequencies. With digital decimator 16 (FIG. 1) or low pass filter 36 (FIG. 3) having a low pass response, they remove much of the effects of high frequency quantization noise from the $y_n$ sequence without substantially distorting the low frequency components of the $y_n$ sequence controlled by the low frequency $x_n$ sequence.

For example, $H(z^{-1})$ can be chosen so that input sequence $x_n$ sees only a delayed feed-through, for example by setting $$H(z^{-1}) = \frac{z^{-1}}{1-z^{-1}}$$

to provide a first order loop where $$G(z^{-1}) = z^{-1} \quad [3]$$

$$F(z^{-1}) = 1 - z^{-1} \quad [4]$$

In this example, the input sees only a unit delay $G(z^{-1})=(z^{-1})$ while the additive noise sees a first order, high-pass response $F(z^{-1})=1-z^{-1}$. The noise shaping provided by $F(z^{-1})$ reduces the in-band noise, thereby causing a desirable increase in the in-band signal-to-noise ratio. Although $F(z^{-1})$ also causes an increase in out-of-band noise, the out-of-band noise can be largely removed from D by digital decimator 16 or low pass filter 36.

In the above example, a single zero at DC appears in noise transfer function $F(z^{-1})$. However some designers provide a noise-shaping transfer function $F(z^{-1})$ having multiple zeros at DC or distributed over the signal band, though it is necessary to choose $F(z^{-1})$ carefully to ensure system stability, particularly for systems implementing higher order feedback loops. (The low-pass or band-pass characteristics of decimator 16 or low pass filter 36 are suitably selected to complement the noise shaping characteristics of the $F(z^{-1})$ transfer function.) Thus one of the most important tasks in designing a sigma-delta DAC or ADC is to chose the transfer function $H(z^{-1})$ of the sigma-delta modulator or demodulator. $H(z^{-1})$ can be written in zero-pole form as:

$$H(z^{-1}) = \frac{B(z^{-1})}{A(z^{-1})} = \frac{\prod_{i=1}^{NZ}(1-z^{-1}z_i)}{\prod_{i=1}^{NP}(1-z^{-1}p_i)}$$

where NZ and NP are the total number of zeros and poles, respectively. Using the above representation for $H(z^{-1})$ we obtain $$G(z^{-1}) = \frac{H(z^{-1})}{1+H(z^{-1})} = \frac{B(z^{-1})}{A(z^{-1})+B(z^{-1})}$$

$$F(z^{-1}) = \frac{1}{1+H(z^{-1})} = \frac{A(z^{-1})}{A(z^{-1})+B(z^{-1})}$$

From the above expressions for input and error transfer functions $G(z^{-1})$ and $F(z^{-1})$, it is apparent that we can improve signal-to-noise ratio within the signal band by choosing $A(z^{-1})$ to be small and $B(z^{-1})$ to be large within that signal band. However one major limitation of prior art sigma-delta ADCs and DACs is that $A(z^{-1})$ and $B(z^{-1})$ cannot be chosen independently. In practice, designers initially choose $A(z^{-1})$ to provide desired noise shaping characteristics, for example to provide multiple zeros at DC or distributed over the signal band. With $A(z^{-1})$ thus established, designers then choose $B(z^{-1})$ to provide a desired input transfer function $G(z^{-1})$, but the range of choices of $B(z^{-1})$ are restricted to values that will keep the system stable and which render $G(z^{-1})$ essentially a delaying feed-through so as to avoid distorting the input sequence. The tight interdependence of $G(z^{-1})$ and $F(z^{-1})$ therefore limits the freedom a designer has when designing a sigma-delta ADC or DAC.

What is needed is a sigma-delta data converter architecture that reduces the interdependence of $G(z^{-1})$ and $F(z^{-1})$ so that the designer has more freedom to independently adjust the signal and noise transfer functions.

BRIEF SUMMARY OF THE INVENTION

A sigma-delta data converter in accordance with the invention converts an analog or digital input sequence of elements $x_n$, each representing a magnitude with at least p-bit resolution, into an m-bit output sequence $y_n$, where p>m>0. The sigma-delta data converter offsets the $x_n$ element sequence by a first feedback sequence of elements $c_n$ proportional in magnitude to output sequence elements $y_n$ thereby to produce a sequence of analog or digital elements $a_n$. The sigma-delta data converter passes the $a_n$ sequence through an analog or digital filter having a transfer function $H(z^{-1})$ to produce a sequence of elements $d_n$ that are offset by an error feedback sequence of elements $r_n$ to produce an analog or digital sequence of elements $b_n$, each having more than m bits. The digital or analog elements $b_n$ are then quantized (either by an m-bit analog-to-digital converter or by a digital quantizer) to produce the m-bit output $y_n$ sequence.

In accordance with the invention, to increase the signal-to-noise ratio at a signal band of interest, the sigma-delta data converter includes a quantization error feedback circuit for processing the $b_n$ and $y_n$ elements to generate a sequence of elements $e_n$, each representing a quantization error between magnitudes represented by corresponding sequence elements $b_n$ and $y_n$. The error feedback circuit filters the sequence of elements $e_n$ with a transfer function $R(z^{-1})$ to produce the $r_n$ sequence.

In an embodiment of the invention in which the sigma-delta data converter is a digital-to-analog converter, where the $x_n$ element sequence is a digital representation of an analog waveform to be generated, an m-bit digital-to-analog converter converts the sequence of elements $y_n$ into an analog signal that is filtered by a low pass or band pass filter to produce the analog waveform specified by the $x_n$ element sequence. The filter removes the out-of-band quantization noise from the analog waveform.

In an embodiment of the invention in which the sigma-delta data converter is an analog-to-digital converter, where the $x_n$ element sequence is a sequence of analog samples of an analog waveform, a digital decimator filters and reduces the sampling rate of the $y_n$ sequence by a factor of k to produce an output data sequence D representing the analog waveform. The filtration provided by the decimator removes out-of-band quantization noise from data sequence D.

The invention permits the quantization noise in the $y_n$ sequence to be shaped by transfer function $R(z^{-1})$ without affecting the response of the sigma-delta data converter relative to the $x(n)$ sequence, which is determined by transfer function $H(z^{-1})$ and not influenced by transfer function $R(z^{-1})$.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

BRIEF DESCRIPTION OF THE DRAWINGS

FIG. 1 illustrates a prior art sigma-delta analog-to-digital converter (ADC) in block diagram form, FIG. 2 is a timing diagram illustrating an example of timing relationships between signals of the sigma-delta ADC of FIG. 1, FIG. 3 illustrates a prior art sigma-delta digital-to-analog converter (DAC) in block diagram form;

FIG. 4 is an equivalent circuit diagram representing the prior art sigma-delta ADC or DAC of FIG. 1 or 3, FIG. 5 illustrates a sigma-delta ADC in accordance with the invention in block diagram form, FIG. 6 is a timing diagram illustrating an example of timing relationships between signals of the sigma-delta ADC of FIG. 5, FIG. 7 illustrates a sigma-delta DAC in accordance with the invention in block diagram form, FIG. 8 is a timing diagram illustrating an example of timing relationships between signals of the sigma-delta DAC of FIG. 7, FIG. 9 is an equivalent circuit diagram representing the sigma-delta ADC or DAC of FIG. 5 or 7, and FIG. 10 illustrates an alternative embodiment of a sigma-delta DAC in accordance with the invention in block diagram.

DETAILED DESCRIPTION OF THE INVENTION

The invention as described below relates to a sigma-delta data converter providing quantization error feedback to improve its signal-to-noise ratio. While the specification describes exemplary embodiments of the invention considered to be the best modes of practicing the invention, those of skill in the art will appreciate other modes of practicing the invention are possible.

Sigma-Delta ADC

Figure 5:
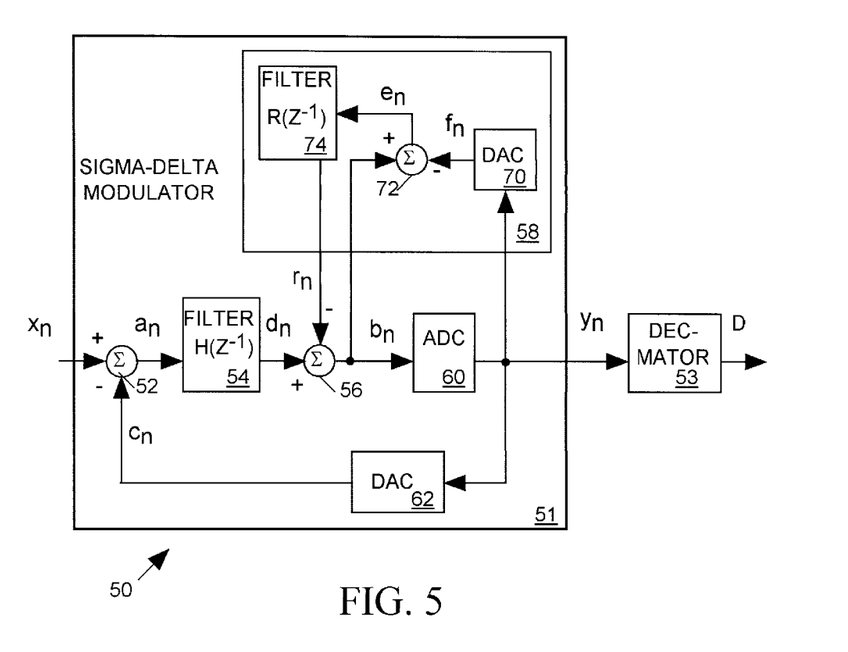

FIG. 5 illustrates a sigma-delta analog-to-digital converter (ADC) 50 in accordance with the invention for converting an input sequence of analog data elements $x_n$ into an output digital data sequence D. The $x_n$ sequence could be produced, for example, by periodically sampling a time-varying analog signal. ADC 50 includes a sigma-delta demodulator 51, and a decimator 53.

Sigma-delta modulator 51 converts the analog input sequence $x_n$ into a digital sequence $y_n$. Each element of the analog input sequence $x_n$ has p-bit resolution in that it can be of any of $2^p$ different discrete analog voltage or current levels. Elements $y_n$ of the demodulator output sequence are m bits wide, where 0<m<p. Thus each m-bit element of the $y_n$ sequence has m-bit resolution and can represent $2^m$ different discrete magnitudes. Decimator 53 carries out the function of a finite impulse response (FIR) filter, filtering the $y_n$ sequence to produce a sequence of elements $$D_n = \sum_{i=-N1}^{N2} f_i y_{n-i}$$

where N1 and N2 are integers and FIR filter coefficients $f_{-N1}$–$f_{N2}$ are real numbers selected to give decimator 53 appropriate low pass or band pass characteristics to eliminate aliasing and out-of-band quantization noise. Decimator 52 also reduces the number of elements of the $D_n$ sequence by a factor of k to produce output sequence D so that only every kth element of the $D_n$ sequence becomes an element of the D sequence.

Figure 6:
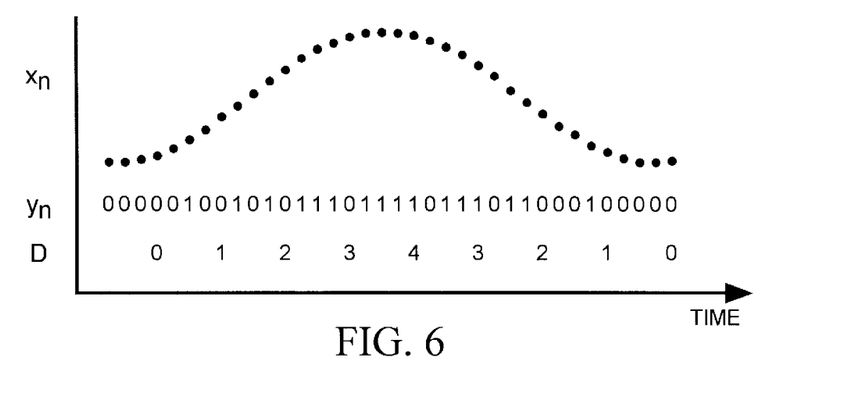

FIG. 6 illustrates the relationship between values of the $x_n$, $y_n$ and D sequences in an example in which m=1, k=4 and the $x_n$ sequence represents discrete analog samples of a sine wave signal. In such case, the density of 1's in the $y_n$ sequence varies with time in the same sinusoidal fashion as the magnitude of the $x_n$.

Sigma-delta ADC modulator 51 includes a summer 52 for producing an output sequence $a_n$, where $$a_n = x_n - c_n$$

where $c_n$ is a sequence produced by an m-bit DAC 62 in response to $y_n$. A filter 54 having a transfer function $H(z^{-1})$ filters an to produce an output sequence $d_n$. Another summer 56 generates a sequence $b_n$ where $$b_n = d_n - r_n$$

where $r_n$ is a sequence generated by a quantization error feedback circuit 58 in accordance with the invention. An analog-to-digital converter 60 quantizes the $b_n$ sequence to produce the output $y_n$ sequence. Error feedback circuit 58 generates $r_n$ as a function of $b_n$ and $y_n$.

Since the analog $b_n$ sequence elements represent quantities with higher resolution than their corresponding $y_n$ elements, they do not always represent exactly the same values. The difference between the quantity represented by each $y_n$ sequence element and the quantity represented by its corresponding $b_n$ sequence element is the "quantization error" of modulator 51, and that quantization error appears as "quantization noise" in the $y_n$ sequence.

Error feedback circuit 58 includes an m-bit DAC 70 and a summer 72 for producing an error sequence $e_n$ indicating successive magnitudes of the quantization error, the difference between the quantities represented by corresponding $b_n$ and $y_n$ sequence elements. DAC 70 converts the digital $y_n$ sequence into an analog sequence $f_n$ and summer 72 subtracts elements $f_n$ from corresponding elements $b_n$ to produce error sequence $e_n$. A discrete time analog filter 74 filters error sequence $e_n$ with a transfer function $R(z^{-1})$ to produce the $r_n$ sequence supplied as input to summer 56.

Sigma-Delta DAC

Figure 7:
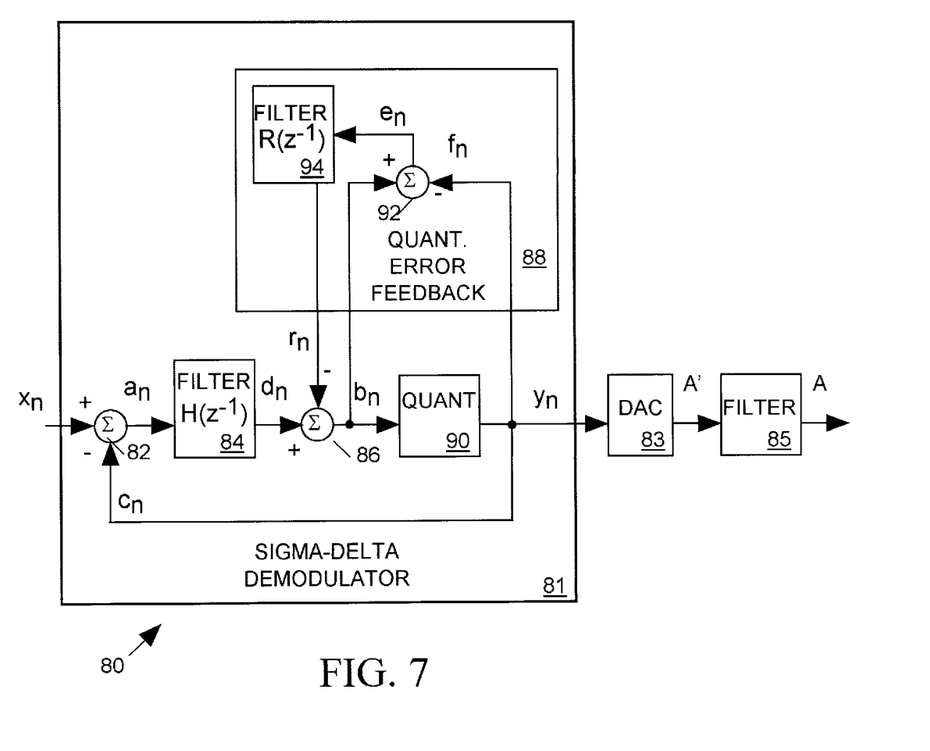

FIG. 7 illustrate a sigma-delta digital-to-analog converter (DAC) 80 in accordance with the invention for producing an output analog signal A in response to a input data sequence $x_n$ representing successive magnitudes of the output analog signal. DAC 80 includes a sigma-delta demodulator 81, a DAC 83, and an analog filter 85. Sigma-delta demodulator 81 converts the p-bit $x_n$ sequence into an m-bit $y_n$ sequence. DAC 83 produces an output analog signal A' of magnitude controlled by the $y_n$ sequence, and filter 85 filters the A' signal 83 to produce the analog output signal A.

Sigma-delta demodulator 81 includes a summer 82 for producing a p-bit digital sequence $a_n$ where $$a_n = x_n - c_n.$$

A digital filter 84 filters sequence $a_n$ to produce an output sequence $d_n$. Another summer 86 generates a sequence $b_n$ where $$b_n = d_n - r_n.$$

A digital quantizer 90 quantizes the $b_n$ sequence to produce the m-bit output $y_n$ sequence.

An error feedback circuit 88 in accordance with the invention generates the $r_n$ sequence as a function of $b_n$ and $y_n$. Since each element of the analog $b_n$ sequence has more bits than corresponding elements of the $y_n$ sequence, they do not always represent exactly the same value. The difference between the quantity represented by each element $b_n$ and its corresponding element $y_n$ is the quantization error of demodulator 81 which appears as quantization noise in the $y_n$ sequence.

Error feedback circuit 88 includes a summer 92 for subtracting $y_n$ from the m most significant bits of $b_n$ to produce a digital error sequence $e_n$ indicating successive magnitudes of the quantization error. A digital filter 94 filters error sequence $e_n$ with a transfer function $R(z^{-1})$ to produce the $r_n$ sequence supplied as input to summer 86. As discussed below, the transfer function of filter 94 of error feedback circuit 88 can be adjusted to shape the quantization noise so that most of it occurs in bands not otherwise occupied by components of the analog signal the $x_n$ sequence represents. For example, when the analog signal represented by $x_n$ has only low frequency components, the quantization noise can be shaped so that it appears mainly at higher frequencies. Therefore with filter 85 designed as a low pass filter, it can filter substantially all of the effects of quantization error from signal A' to produce output signal A.

Figure 8:
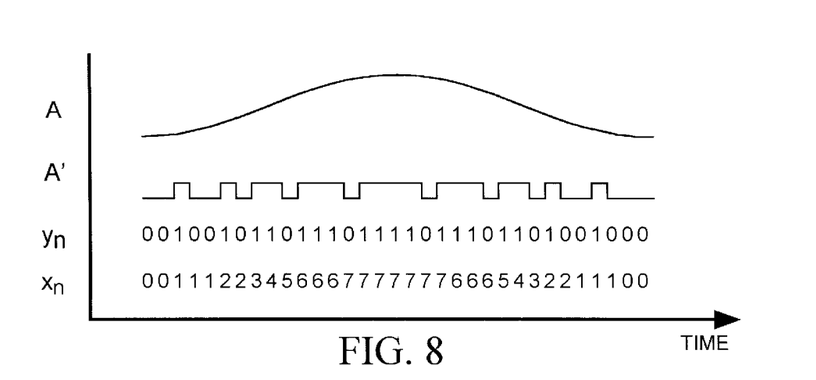

FIG. 8 illustrates the behavior of $x_n$, $y_n$, A' and A in an example in which m=1, p=3, $x_n$ ranges between integers 0 and 7 as a stepwise approximation of a sine wave, and $y_n$ may be either a 0 or a 1.

Noise Shaping Using Error Feedback

Figure 9:
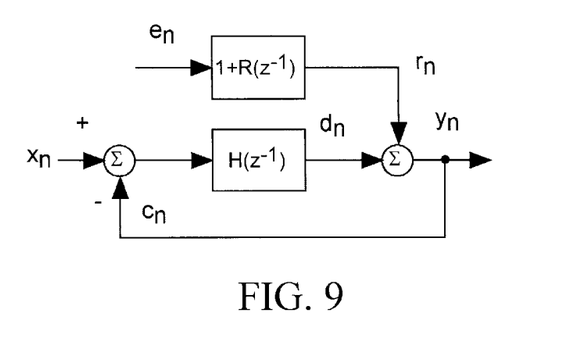

FIG. 9 is an equivalent representation of either sigma-delta ADC 50 of FIG. 5 or sigma-delta DAC 80 of FIG. 7 showing relations between $x_n$, $e_n$ and $y_n$. The z-transform $Y(z^{-1})$ of the $y_n$ sequences can be expressed as a linear combination of z-transforms $X(z^{-1})$ and $E(z^{-1})$ of input and error sequences $x_n$ and $e_n$ as follows:

$$Y(z^{-1}) = \frac{H(z^{-1})X(z^{-1})}{1+H(z^{-1})} + \frac{(1+R(z^{-1}))E(z^{-1})}{1+H(z^{-1})}$$

For example, when we choose $H(z^{-1})=z^{-1}/(1-z^{-1})$, then $Y(z^{-1})$ becomes:

$$Y(z^{-1})=z^{-1}X(z^{-1})+(1-z^{-1})(1+R(z^{-1})E(z^{-1})$$

The converter's transfer function $G(z^{-1})$, as seen by input sequence $x_n$ is:

$$G(z^{-1}) = \frac{Y(z^{-1})}{X(z^{-1})}\bigg|_{E(z^{-1})=0} = z^{-1} \quad [5]$$

The converter's transfer function $F(z^{-1})$, as seen by error sequence $e_n$ is:

$$F(z^{-1}) = \frac{Y(z^{-1})}{E(z^{-1})}\bigg|_{X(z^{-1})=0} = (1-z^{-1})(1+R(z^{-1})) \quad [6]$$

Figure 1:
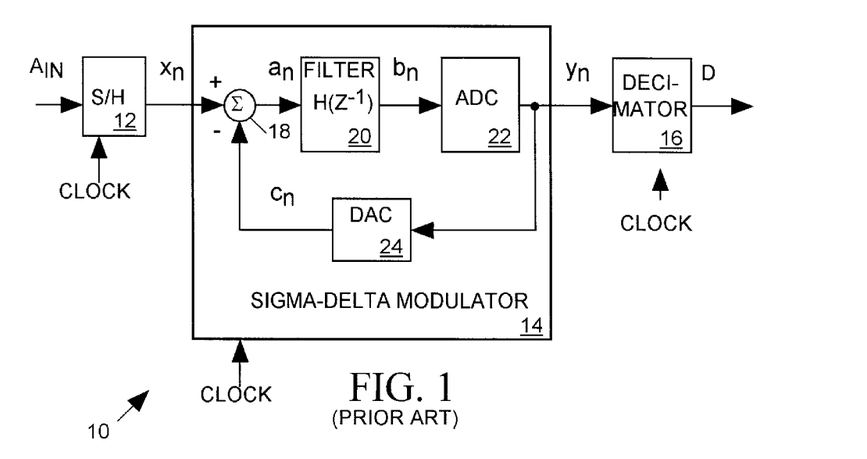
Figure 2:
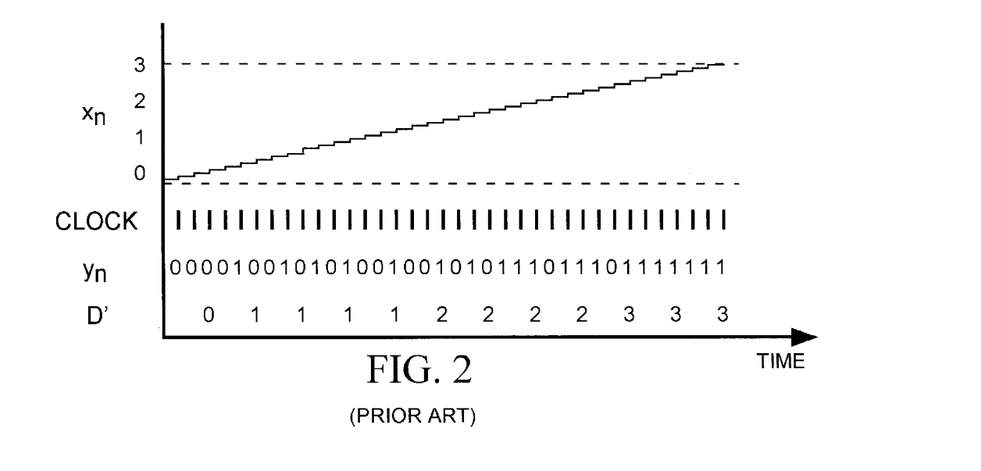
Figure 3:
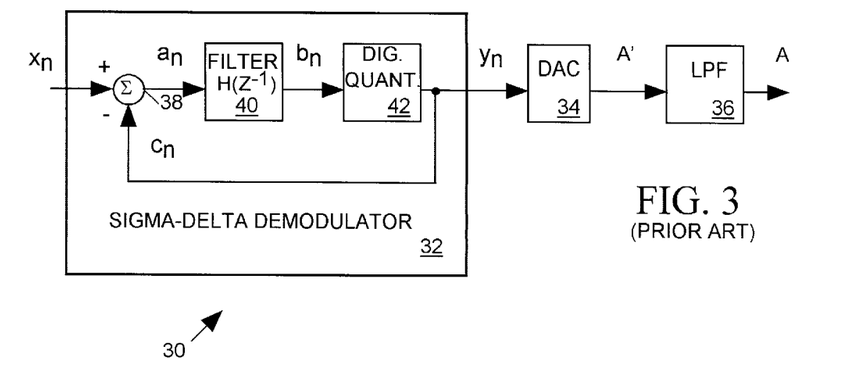
Figure 4:
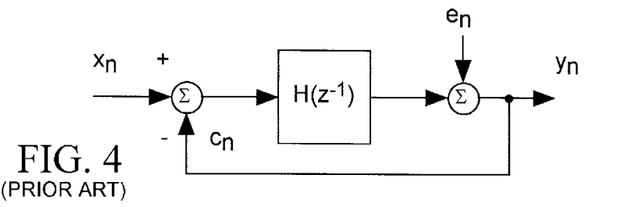

Thus to input sequence $x_n$, the converter's transfer function $G(z^{-1})$ acts a unit delay, as does the transfer function $G(z^{-1})$ of the prior are sigma-delta data converter 14 of FIG. 1. Compare equations [3] and [5] above. On the other hand, as may be seen by comparing equations [4] and [6] above, the transfer function $F(z^{-1})$ for the converter's additive noise differs from that of prior art converter of FIG. 1 in that it contains an additional term $(1+R(z^{-1}))$ resulting from the feedback provided by error feedback circuit 58 of FIG. 5. Since the input sequence $x_n$ does not see $1+R(z^{-1})$, that additional term allows a designer the freedom to control noise shaping by adjusting the transfer function $R(z^{-1})$ of filter 74. Note that since $G(z^{-1})$ does not depend on $R(z^{-1})$, the designer can adjust $R(z^{-1})$ without having to take into account the stability of the output signal feedback loop or the response $G(z^{-1})$ seen by input sequence $x_n$. For example one of many possible choices for the term $(1+R(z^{-1}))$ is $(1-z^{-1})$, which provides second order noise shaping. The quantization error feedback circuits 58 and 88 of the sigma-delta data converters of FIGS. 5 and 7 provide the designer with more freedom to design an error transfer function, for example to distribute multiple zeros over the signal band without causing loop instability or distorting the output.

Figure 10:
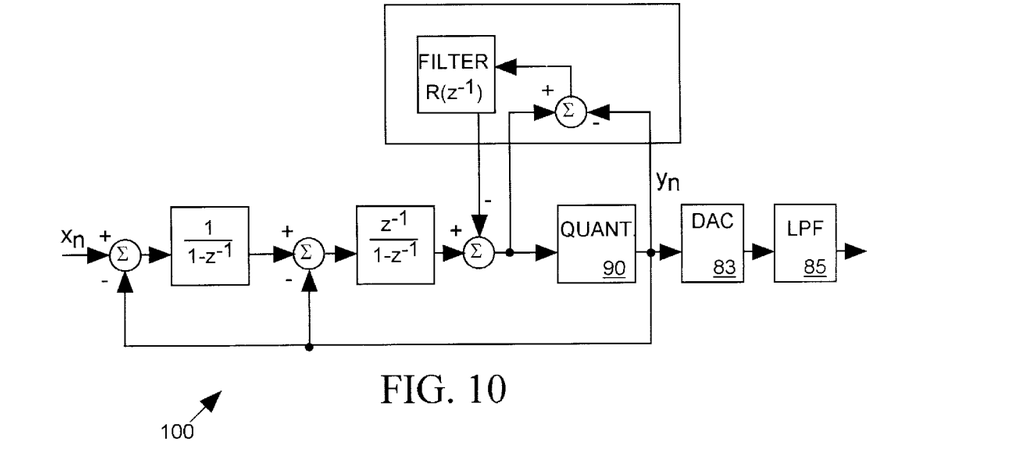

The foregoing specification and the drawings depict exemplary embodiments of the best mode(s) of practicing the invention, and elements or steps of the depicted best mode(s) exemplify the elements or steps of the invention as recited in the appended claims. For example, although quantization error feedback in accordance with the invention are described above in connection with its use in a $1^{st}$ order sigma-delta data converter, quantization error feedback can be used in connection with higher order sigma-delta data converters. For example, FIG. 10 illustrates the use of quantization error feedback circuit in a $2^{nd}$ order sigma-delta DAC 100. Also designers may select other values of $H(z^{-1})$ and $R(z^{-1})$ than those suggested above. The claims below are therefore intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

What is claimed is:

1. A method for converting a sequence of elements $x_n$ into a sequence of elements $y_n$, wherein each element $x_n$ represents a magnitude with at least p-bit resolution and each element $y_n$ is an m-bit digital data word, wherein m and p are integers and wherein p>m>0, the method comprising the steps of:

a. providing a sequence of elements $c_n$ in response to the sequence of elements $y_n$ wherein each element $c_n$ corresponds to a separate element $y_n$ and represents similar a magnitude;

b. generating a sequence of elements $a_n$, each representing a magnitude proportional to a difference in magnitudes represented by a separate concurrently occurring pair of elements $x_n$ and $c_n$;

c. filtering the sequence of elements $a_n$ to produce a sequence of elements $d_n$;

d. generating a sequence of elements $b_n$ in response to the sequence of elements $d_n$ and a sequence of elements $r_n$, wherein each element $b_n$ represents with at least p-bit resolution a difference in magnitudes represented by a separate concurrently occurring pair of elements $d_n$ and $r_n$;

e. generating each element $y_n$ in response to a corresponding one of elements $b_n$, wherein each element $y_n$ represents with m-bit resolution a same magnitude its corresponding element of the $b_n$ sequence represents with at least p-bit resolution; and f. generating the sequence of elements $r_n$ as a function of a quantization error differences between magnitudes represented by corresponding pairs of elements $b_n$ and $y_n$.

2. The method in accordance with claim 1 wherein step f comprises the substeps of:

f1. generating a sequence of elements $f_n$, each representing a quantization error difference between magnitudes represented by a corresponding pair of elements $b_n$ and $y_n$; and f2. filtering the $f_n$ sequence to produce the $r_n$ sequence representing magnitudes.

3. The method in accordance with claim 1 wherein elements $x_n$, $a_n$, $b_n$, $c_n$ and $r_n$ comprise discrete analog signal levels representing magnitudes.

4. The method in accordance with claim 3 wherein each element $c_n$ is generated at step a by a first m-bit digital-to-analog converter in response to its corresponding one of elements $y_n$.

5. The method in accordance with claim 3 wherein each element $y_n$ is generated at step e by an m-bit analog-to-digital converter in response to its corresponding one of elements $b_n$.

6. The method in accordance with claim 1
wherein each element $c_n$ is generated at step a by a first m-bit digital-to-analog converter in response to a corresponding one of elements $y_n$,
wherein each element of sequence $y_n$ is generated at step e by an m-bit analog-to-digital converter in response to its corresponding element of sequence $b_n$, and
wherein step f comprises the substeps of:
f1. generating a sequence of elements $f_n$, each representing the quantization error difference between magnitudes represented by a concurrently occurring pair of elements $b_n$ and $y_n$; and
f2. filtering the $f_n$ sequence to produce the $r_n$ sequence.

7. The method in accordance with claim 1 wherein each of elements $x_n$, $a_n$, $b_n$, $c_n$, and $r_n$ is a digital data word.

8. The method in accordance with claim 7 wherein each of elements is generated at step e by a digital quantizer in response to a separate one of elements $b_n$.

9. The method in accordance with claim 8 wherein step f comprises the substeps of:

f1. generating a sequence of elements $f_n$, each representing the quantization error difference between magnitudes represented by a concurrently occurring pair of elements $b_n$ and $y_n$; and f2. filtering the $f_n$ sequence to produce the $r_n$ sequence.

10. The method in accordance with claim 7 further comprising the step of:

g. processing the sequence of elements $y_n$ to produce a sequence D consisting of every kth element $D_n$ of a sequence $$D_n = \sum_{i=-N1}^{N2} f_i y_{n-i}$$

where N1 and N2 are integers and $f_{-N1}$ through $f_{N2}$ are a real numbers.

11. An apparatus for processing a sequence of elements $x_n$, each representing a magnitude, the apparatus comprising:

first means for providing a sequence of elements $c_n$ in response to a sequence of elements $y_n$, wherein elements $y_n$ are m-bit data words representing magnitudes with m-bit resolution, wherein concurrently occurring elements $c_n$ and $y_n$ represent similar magnitudes;

second means for generating a sequence of elements $a_n$ in response to the sequences of elements $x_n$ and $c_n$, wherein each element $a_n$ represents a magnitude proportional to a difference between magnitudes represented by a separate concurrently occurring pair of elements $x_n$ and $c_n$;

third means for filtering the sequence of elements $a_n$ to produce a sequence of elements $d_n$;

fourth means for generating a sequence of elements $b_n$ in response to the sequence of elements $d_n$ and a sequence of elements $r_n$, wherein each element $b_n$ represents with at least p-bit resolution a magnitude proportional to a difference between magnitudes represented by a separate concurrently occurring pair of elements $d_n$ and $r_n$, wherein m and p are integers and, wherein p>m>0, fifth means for generating the sequence of elements $y_n$ in response to the sequence of elements $b_n$, wherein each element $y_n$ corresponds to a separate one of elements $b_n$ and represents with m-bit resolution a same magnitude its corresponding element $b_n$ represents with at least p-bit resolution; and sixth means for generating the sequence of elements $r_n$ wherein each element $r_n$ sequence represents a magnitude proportional to a quantization error difference between magnitudes represented by a separate corresponding pair of elements $b_n$ and $y_n$.

12. The apparatus in accordance with claim 11 wherein the sixth means comprises:

seventh means for generating a sequence of elements $f_n$, wherein each element $f_n$ represents a quantization error difference between magnitudes represented by a corresponding pair of elements $b_n$ and $y_n$; and eighth means for filtering the $f_n$ sequence to produce the $r_n$ sequence.

13. The apparatus in accordance with claim 11 wherein elements $x_n$, $a_n$, $b_n$, $c_n$, and $r_n$ comprise discrete analog signal levels.

14. The apparatus in accordance with claim 11 wherein the first means comprises an m-bit digital-to-analog converter for converting each element $y_n$ into a corresponding one of elements $c_n$.

15. The apparatus in accordance with claim 11 wherein the second means comprises an m-bit analog-to-digital converter for generating each element $y_n$ in response to a corresponding one of elements $b_n$.

16. The apparatus in accordance with claim 11 wherein each of elements $x_n$, $a_n$, $b_n$, $c_n$, and $r_n$ is a digital data word.

17. The apparatus in accordance with claim 11 wherein the fifth means comprises a digital quantizer for generating each of elements $y_n$ in response to a corresponding one of elements $b_n$.

18. The apparatus in accordance with claim 15 further comprising:

an m-bit digital-to-analog converter for converting the sequence of elements $y_n$ into a first analog signal.

19. The apparatus in accordance with claim 18 further comparing:

a low pass filter for filtering the first analog signal, thereby to produce a second analog signal.

20. The apparatus in accordance with claim 11 further comprising:

a decimator for filtering the sequence of elements $y_n$ to produce one element of a sequence D for each k successive elements $y_n$ where k is an integer greater than 1.

21. The apparatus in accordance with claim 20 wherein sequence D consists of every kth element $D_n$ of a sequence $$D_n = \sum_{i=-N1}^{N2} f_i y_{n-i}$$

where N1 and N2 are integers and $f_{-N1}$ through $f_{N2}$ are real numbers.

22. The apparatus in accordance with claim 21 wherein $f_{-N1}$ through $f_{N2}$ are sized such that the decimator has a low pass transfer function.

23. A sigma-delta data converter comprising:

first means for generating a sequence of elements $d_n$ representing magnitudes;

second means for generating a sequence of elements $y_n$ in response to a sequence of elements $b_n$, wherein each of elements $y_n$ represents a same magnitude as a corresponding one of elements $b_n$ but with lower resolution;

third means for generating a sequence of elements $r_n$ of magnitudes that are functions of a quantization error difference between magnitudes represented by corresponding pairs of elements $b_n$ and $y_n$; and fourth means for generating the sequence of element $b_n$, wherein each element $b_n$ represents a difference between magnitudes represented by a corresponding pair of elements $d_n$ and $r_n$.

24. The sigma-delta data converter in accordance with claim 23 wherein the third means comprises:

means for generating a sequence of elements $f_n$, each representing a quantization error difference between magnitudes represented by a corresponding pair of elements $b_n$ and $y_n$; and means for filtering the $f_n$ sequence to produce the $r_n$ sequence.

25. The sigma-delta data converter in accordance with claim 24 further comprising:

fifth means for providing a sequence of elements $c_n$ in response to the sequence of elements $y_n$, wherein corresponding pairs of elements $c_n$ and $y_n$ represent similar magnitudes; and sixth means for generating the sequence of elements $d_n$ in response to the sequences of elements $c_n$ and $x_n$.

26. The sigma-delta data converter in accordance with claim 25 wherein the sixth means comprises:

means for generating a sequence of elements $a_n$, wherein each element $a_n$ represents a magnitude proportional to a difference between a corresponding pair of elements $x_n$ and $c_n$; and means for filtering sequence $a_n$ital-to-analog converter for converting sequence $y_n$ into a first analog signal.

27. The sigma-delta data converter in accordance with claim 26 further comprising:

a digital-to-analog converter for converting sequence $y_n$ into a first analog signal.

28. The sigma-delta data converter in accordance with claim 27 further comprising:

a low pass filter for filtering the first analog signal, thereby to produce a second analog signal.

29. The sigma-delta data converter in accordance with claim 26 further comprising:

a digital decimator for filtering sequence $y_n$ to produce a sequence D' of elements wherein each element of sequence D' corresponds to a separate set of k elements of sequence $y_n$ and represents a magnitude that is proportional to a sum of magnitudes proportional to a sum of magnitudes represented by the corresponding set of k elements of sequence $y_n$, where k is an integer greater than 1.

30. The sigma-delta data converter in accordance with claim 29 further comprising:

a digital low pass filter for filtering sequence D' to produce a sequence D.

* * * * *